United States Patent
Zhou et al.

(10) Patent No.: US 9,431,441 B1
(45) Date of Patent: Aug. 30, 2016

(54) IMAGE SENSOR PIXEL STRUCTURE

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW); Chen-Bin Lin, Taipei (TW); Chun-Yuan Wu, Yun-Lin County (TW); Chia-Fu Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/834,452

(22) Filed: Aug. 25, 2015

(30) Foreign Application Priority Data

Jul. 29, 2015 (CN) .......................... 2015 1 0453692

(51) Int. Cl.
*H01L 29/10* (2006.01)
*H01L 27/146* (2006.01)
*H01L 29/786* (2006.01)

(52) U.S. Cl.
CPC ..... *H01L 27/14612* (2013.01); *H01L 27/1464* (2013.01); *H01L 27/14609* (2013.01); *H01L 27/14636* (2013.01); *H01L 27/14643* (2013.01); *H01L 29/7869* (2013.01)

(58) Field of Classification Search
CPC ............. H01L 27/146; H01L 27/1464; H01L 27/307; H01L 27/3234
USPC .................................. 257/43, 291, 432, 435
See application file for complete search history.

(56) References Cited

U.S. PATENT DOCUMENTS

| | | | |
|---|---|---|---|
| 8,890,152 B2 | 11/2014 | Yamazaki et al. | |
| 2009/0303366 A1* | 12/2009 | Gambino | H01L 27/14632 348/308 |
| 2011/0260221 A1* | 10/2011 | Mao | H01L 27/1464 257/291 |
| 2013/0020468 A1* | 1/2013 | Mitsuhashi | H01L 27/14623 250/208.1 |

* cited by examiner

*Primary Examiner* — Brook Kebede
(74) *Attorney, Agent, or Firm* — Winston Hsu; Scott Margo

(57) ABSTRACT

A back side illumination image sensor pixel structure includes a substrate having a front side and a back side opposite to the front side, a sensing device formed in the substrate to receive an incident light through the back side of the substrate, two oxide-semiconductor field effect transistor (OS FET) devices formed on the front side of the substrate, and a capacitor formed on the front side of the substrate. The two OS FET devices are directly stacked on the sensing device and the capacitor is directly stacked on the OS FET devices. The two OS FET devices overlap the sensing device, and the capacitor overlaps both of the OS FET devices and the sensing device.

20 Claims, 4 Drawing Sheets

IMAGE SENSOR PIXEL STRUCTURE

BACKGROUND OF THE INVENTION

1. Field of the Invention

The present invention relates to an image sensor pixel structure, and more particularly, to a backside illumination (hereinafter abbreviated as BSI) image sensor pixel structure.

2. Description of the Prior Art

With the development of computer and communications industries, demand for high-efficiency image sensor has been increased. Such image sensors are used in various fields, such as digital cameras, camcorders, personal communications systems, game components, monitors, medical micro camera, robots, etc.

BSI image sensors are popular high-efficiency image sensors in the present industry. Because BSI image sensor fabrication can be easily integrated into conventional semiconductor processes, it has advantages of low cost, tiny size, and high integration. Moreover, BSI image sensor itself further has advantages of low operation voltage, lower power consumption, high quantum efficiency, low read-out noise, and random access. Therefore, BSI image sensor is prevalently adopted in the aforementioned electronic products.

With the progress in the semiconductor manufacturing technology, BSI image sensor confronts further demands not only for ever-decreasing size, but also for improvement on photo-electric conversion efficiency and sensitivity, and low noise. Briefly speaking, improvement is always in need.

SUMMARY OF THE INVENTION

According to an aspect of the present invention, a BSI image sensor pixel structure is provided. The BSI image sensor pixel structure includes a substrate having a front side and a back side opposite to the front side, a sensing device formed in the substrate to receive an incident light through the back side of the substrate, two oxide semiconductor field effect transistor (hereinafter abbreviated as OS FET) devices formed on the front side of the substrate, and a capacitor formed on the front side of the substrate. The OS FET devices are directly stacked on the sensing device. Furthermore, the OS FET devices overlap the sensing device. The capacitor is directly stacked on the sensing device and the OS FET devices. Furthermore, the capacitor overlaps the sensing device and the OS FET devices.

According to another aspect of the present invention, an image sensor pixel structure is provided. The image sensor pixel structure includes a substrate having a front side and a back side opposite to the front side, a sensing device formed in the substrate to receive an incident light through the front side or the back side of the substrate, a charge control OS FET device formed on the front side of the substrate and electrically connected to the sensing device, a discharge control OS FET device formed on the front side of the substrate and electrically connected to the charge control OS FET device, and a capacitor formed on the front side of the substrate and electrically connected to the charge control OS FET device and the discharge control OS FET device.

According to the image sensor pixel structure and the BSI image sensor pixel structure provided by the present invention, the two OS FET devices are provided on the front side of the substrate. And the two OS FET devices are electrically connected to the sensing device and the capacitor. From the point of structure, the two OS FET devices overlap the sensing device while the capacitor overlaps the two OS FET devices. Therefore, the sensing device, the two OS FET devices and the capacitor construct a stacked structure. And thus the placement of the OS FET devices and the capacitor occupies and consumes no valuable area on the substrate. From the point of electrical connection, the two OS FET devices respectively serve as a charge control device and a discharge control device. When the discharge control OS FET device is turned on, electrical charges are removed from the capacitor, and when the charge control OS FET device is turned on, electrical charges accessed from the sensing device are stored in the capacitor and subsequently read out. More important, those charges are still stored in the capacitor even though the charge control OS FET device is turned off. Since the OS FET devices suppress short channel effect, it has the advantage of extremely low off-state current. Therefore, power consumption of the image sensor pixel structure and/or BSI image sensor pixel structure is efficaciously and extraordinarily reduced. Briefly speaking, the image sensor pixel structure and/or the BSI image sensor pixel structure provided by the present invention are able to reduce power consumption without consuming valuable area on the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
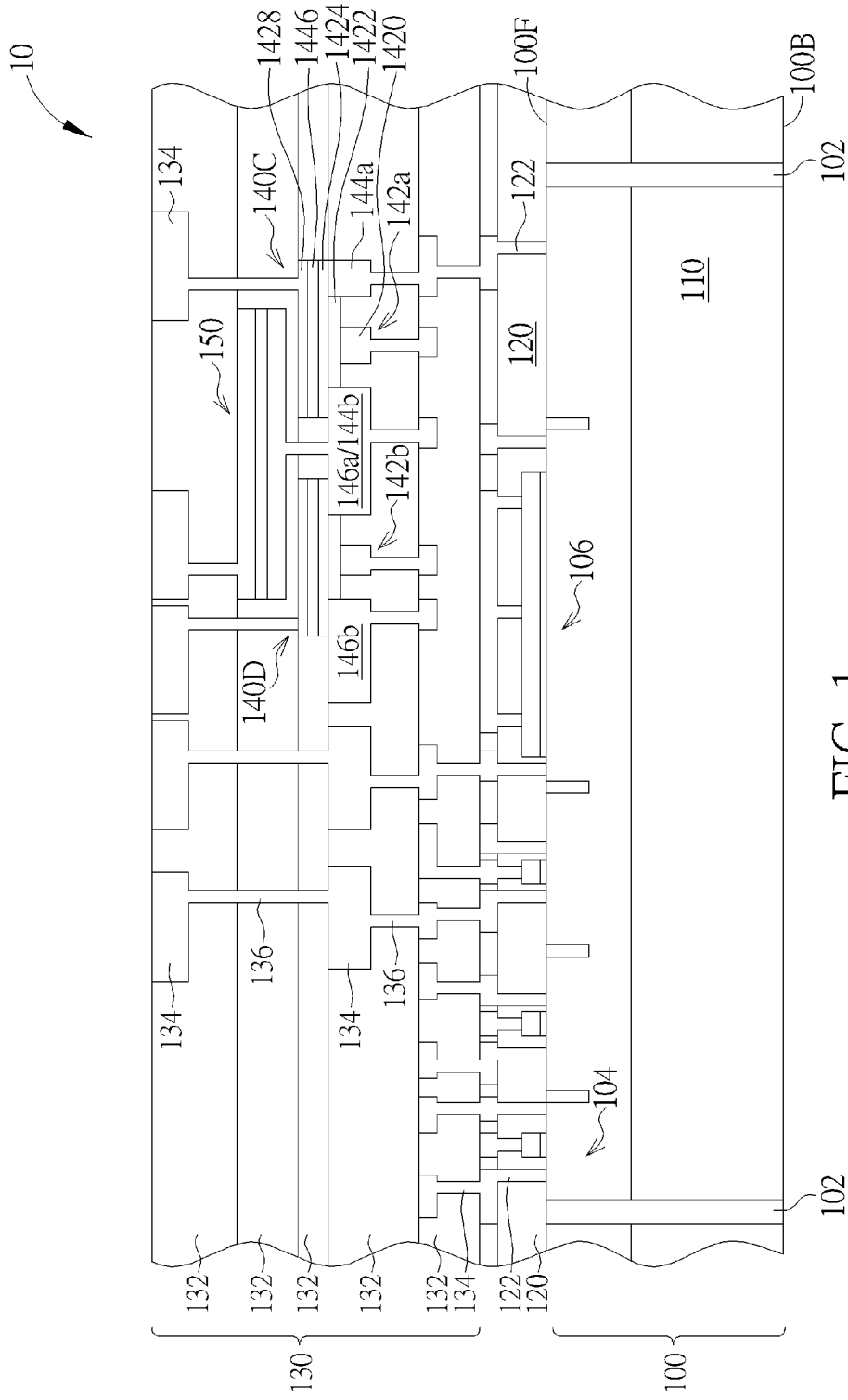
FIG. 1 is a schematic drawing illustrating an image sensor pixel structure provided by a preferred embodiment of the present invention.
Figure 2:
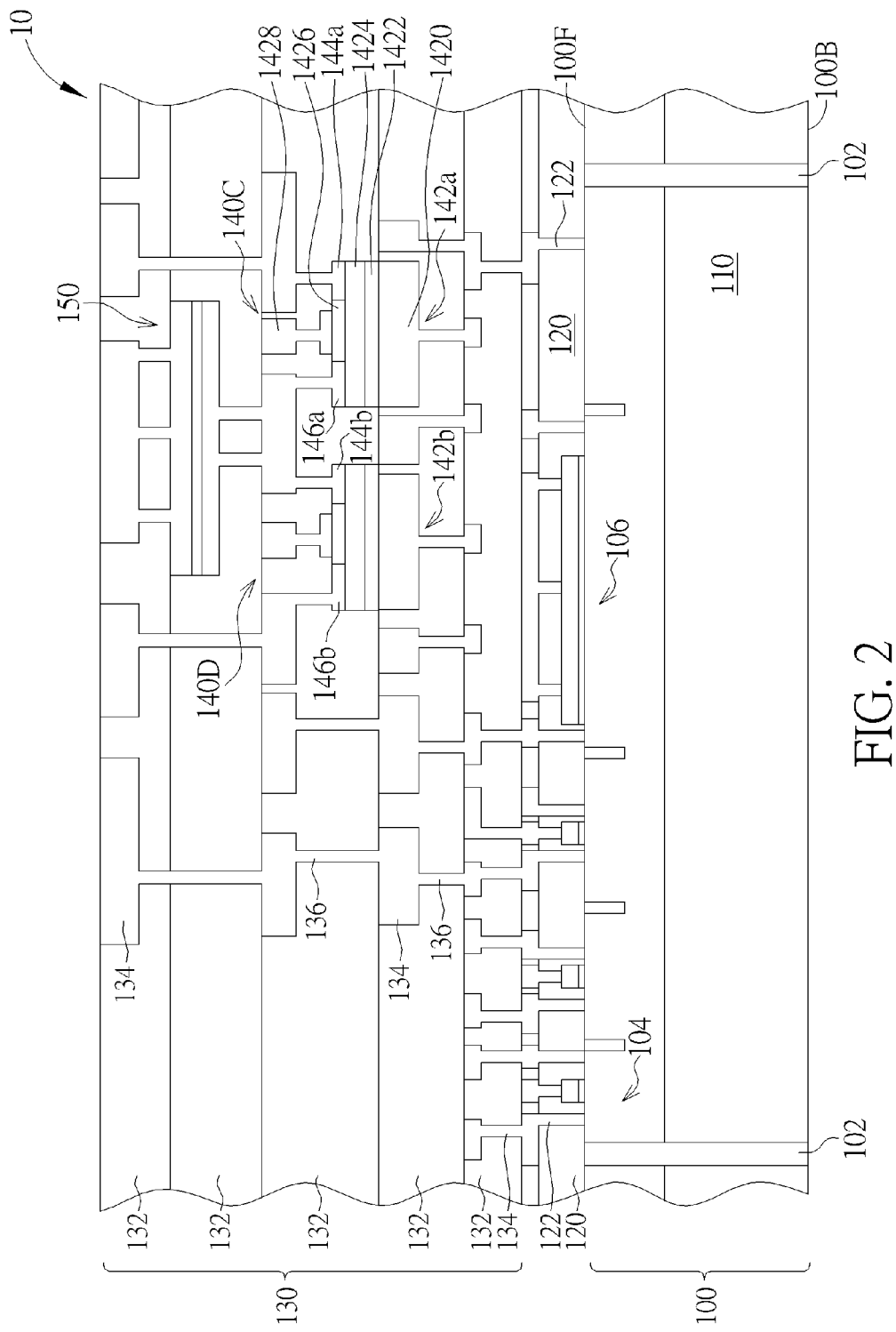
FIG. 2 is a schematic drawing illustrating the image sensor pixel structure provided by another preferred embodiment of the present invention.

Please refer to FIGS. 1 and 2, which are schematic drawings illustrating an image sensor pixel structure provided by preferred embodiments of the present invention. As shown in FIG. 1, the image sensor pixel structure 10 includes a substrate 100. The substrate 100 includes, for example but not limited to, a silicon substrate, a silicon-containing substrate, an III-V group-on-silicon substrate such as a GaN-on-silicon substrate, a graphene-on-silicon substrate, or a silicon-on-insulator (SOI) substrate. The substrate 100 includes a front side 100F and a back side 100B opposite to the front side 100F. A plurality of sensing devices 110, such as photodiodes, are formed in the substrate 100. The substrate 100 further includes a plurality of isolation structures 102 formed therein. The isolation structures 102 are formed to provide electrical isolation between the sensing devices 110 and to prevent noise. The isolation structures 102 can include materials with a refractive index different from the substrate 100. Therefore, the isolation structures 102 not only render electrical isolation between the sensing devices 110 but also cause light reflection toward the sensing devices 110, and thus photo-electric conversion efficiency is improved. It should be understood that for clarifying image sensor pixel structure 10 of the preferred embodiment, only one pixel structure is illustrated as shown in FIG. 1, however those skilled in the art would easily realize other pixel structures formed in the substrate 100 according to the preferred embodiment. Additionally, the pixel structures provided by the present invention can be arranged to form a video graphics array (VGA), or two-dimensional array for high definition (HD), full HD (FHD), 4 k ultra high definition (4 k UHD, or abbreviated as 4 k, e.g. 640*480, 1280*720, 1920*1080, or 3820*2160, but not limited to this.

As shown in FIG. 1, at least a metal-oxide-semiconductor (MOS) transistor device 104 and a MOS capacitor 106 are formed on the front side 100F of the substrate 100. However, those skilled in the art should understand other devices or elements can be formed on the front side 100F of the substrate 100 if required. For example but not limited to, an n-well capacitor can be formed in the front side 100F of the substrate 100. An interlayer dielectric (hereinafter abbreviated as ILD) layer 120 and a plurality of contact plugs 122 formed therein are formed on the front side 100F of the substrate 100. The contact plugs 122 are physically and electrically connected to the MOS transistor 104, the MOS capacitor 106 and the sensing device 110. It is well-known to those skilled in the art that the abovementioned elements such as the isolation structures 102, the sensing device 110, the MOS transistor 104, the MOS capacitor 106, the ILD layer 120, and the contact plugs 122 can be fabricated in and/or on the substrate 100 by front-end-of-line (hereinafter abbreviated as FEOL process, therefore those details are omitted in the interest of brevity.

Please still refer to FIG. 1. An interconnection structure 130 is formed on the front side 100F of the substrate 100. The interconnection structure 130 includes a plurality of dielectric layers 132 such as interlayer dielectric layers or inter-metal dielectric (hereinafter abbreviated as IMD) layers and a plurality of metal layers 134 and plugs 136. The dielectric layers 132 include, for example but not limited to, silicon oxide. The metal layers 134 and the plugs 136 include, also for example but not limited to, aluminum (Al) or copper (Cu). It is well-known to those skilled in the art that the interconnection structure 130 is formed by steps of forming one dielectric layer 132, forming recesses (not shown) in the dielectric layer 132, and filling up the recesses with metal material such as Al or Cu to form the metal layers 134/plugs 136. These abovementioned steps can be repeated any number of times to form the stacked structure of the interconnection structure 130.

Please still refer to FIG. 1. More important, the image sensor pixel structure 10 provided by the preferred embodiment includes two OS FET devices 140C/140D and a capacitor 150 formed on the front side 100F of the substrate 100. Particularly, the two OS FET devices 140C/140D and the capacitor 150 are formed in the interconnection structure 130. As shown in FIG. 1, the two OS FET devices 140C/140D are directly stacked on the sensing device 110. Furthermore, the two OS FET devices 140C/140D overlap the sensing device 110. The capacitor 150 is directly stacked on the sensing device 110 and the OS FET devices 140C/140D. Furthermore, the capacitor 150 overlaps the sensing device 110 and the OS FET devices 140C/140D. Also as shown in FIG. 1, the two OS FET devices 140C and 140D are formed in the same dielectric layer 132 in the interconnection structure 130. However, the OS FET devices 140C/140D and the capacitor 150 are formed in different dielectric layers in the interconnection structure 130. In other words, the OS FET devices 140C/140D are formed in a dielectric layer different from the capacitor 150. Additionally, though the two OS FET devices 140C/140D are formed in IMD layer 132 of the interconnection structure 130 the preferred embodiment, the OS FET devices 140C/140D can be formed in the ILD layer 120.

The OS FET device 140C includes a first gate structure 142a, a first source electrode 144a and a first drain electrode 146a. The OS FET device 140D includes a second gate structure 142b, a second source electrode 144b and a second drain electrode 146b. According to the preferred embodiment, the OS FET devices 140C/140D are devices of double gate type. Therefore as shown in FIG. 1, the first gate structure 142a of the OS FET device 140C and the second gate structure 142b of the OS FET device 140D respectively include a first gate electrode 1420, a first gate dielectric layer 1422, a oxide semiconductor layer 1424, a second gate dielectric layer 1426, and a second gate electrode 1428. In the preferred embodiment, the first gate electrodes 1420 of the first gate structure 142a and the second gate structure 142b, the first source electrode 144a, the first drain electrode 146a, the second source electrode 144b and the second drain electrode 146b can be formed simultaneously with forming the metal layers 134 in the interconnection structure 130, and thus those elements include material the same with the metal layer 134. Additionally, the second gate electrode 1428 can include a material the same with the first gate electrode 1420. The first gate dielectric layer 1422 and the second gate dielectric layer 1426 can include silicon oxide, silicon oxynitride, aluminum oxide, aluminum oxynitride, hafnium oxide, gallium oxide, silicon nitride oxide, and aluminum nitride oxide, or a mixed material thereof. The oxide semiconductor layer 1424 can include, for example but not limited to, indium oxide, tin oxide, zinc oxide, two-component metal oxide such as In—Zn-based oxide, Sn—Zn-based oxide, Al—Zn-based oxide, Zn—Mg-based oxide, Sn—Mg-based oxide, In—Mg-based oxide, or In—Ga-based oxide, three-component metal oxide such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide, and four-component metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, or In—Hf—Al—Zn-based oxide. Furthermore, the oxide semiconductor layer 1424 can include a c-axis aligned crystalline oxide semiconductor (CAAC-OS) material.

Furthermore, the capacitor 150 provided by the preferred embodiment can include a metal-insulator-metal (hereinafter abbreviated as MIM) capacitor, but not limited to this. Additionally, the capacitor 150 can be multi-level MIM if required. Furthermore, as shown in FIG. 1, the first drain electrode 146a and the second source electrode 144b are composed of the same metal layer in the preferred embodiment. In a modification to the preferred embodiment, the metal layer which serves as the first drain electrode 146a and the second source electrode 144b can further serve as a bottom electrode of the capacitor 150.

Furthermore, the abovementioned elements such as the interconnection structure 130, the OS FET devices 140C/140D, and the capacitor 150 can be fabricated by back-end-of-line (hereinafter abbreviated as BEOL) process, therefore those details are omitted in the interest of brevity.

Please refer to FIG. 2, which is a schematic drawing illustrating an image sensor pixel structure provided by another preferred embodiment of the present invention. It is noteworthy that because only the OS FET devices 140C/140D are different from the aforementioned preferred embodiment, the OS FET devices 140C/140D are particularly mentioned while other elements the same in the both preferred embodiments are not detailed. In the preferred embodiment, the OS FET device 140C includes a first gate structure 142a, a first source electrode 144a and a first drain electrode 146a, and the OS FET device 140D includes a second gate structure 142b, a second source electrode 144b and a second drain electrode 146b. As shown in FIG. 2, the OS FET devices 140C/140D are devices of double gate type, therefore the first gate structure 142a and the second gate structure 142b respectively include a first gate electrode 1420, a first gate dielectric layer 1422, an oxide semiconductor layer 1424, a second gate dielectric layer 1426, and a second gate electrode 1428. According to the preferred embodiment, the first the gate electrodes 1420 and the second gate electrodes 1428 of the first gate structure 142a and the second gate structure 142b are formed simultaneously with forming the metal layer 134 in the interconnection structure 130, and thus the first the gate electrodes 1420 and the second gate electrodes 1428 include a material the same with the metal layers 134. The first dielectric layer 1422, the second gate dielectric layer 1426 and the oxide semiconductor layer 1424 can include a material the same with the materials mentioned in the aforementioned embodiment, therefore those details are omitted in brevity. As shown in FIG. 2, the first drain electrode 146a and the second source electrode 144b are formed by different metal layers according to the preferred embodiment. The first drain electrode 146a and the second source electrode 144b are electrically connected to each other and further to the capacitor 150 by other metal layer 134 and plugs 136.

Figure 3:
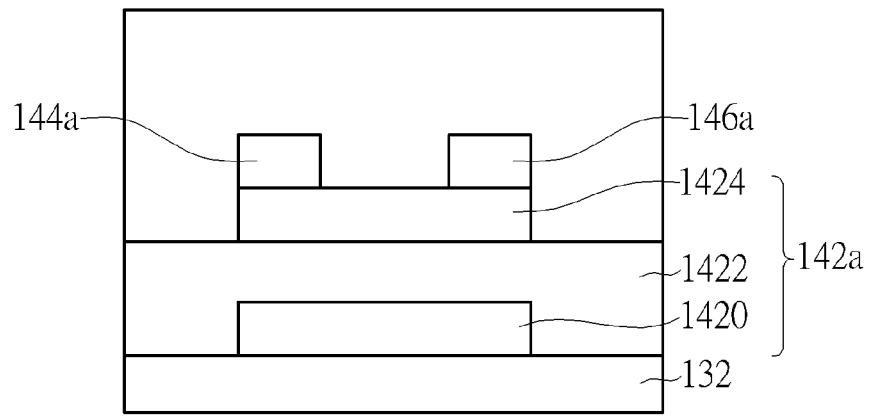
FIG. 3 is a schematic drawing illustrating a modification to the present invention.

Please refer to FIG. 3, which is a schematic drawing illustrating a modification to the present invention. It should be noted that although only the OS FET device 140C is illustrated in FIG. 3, those skilled in the art would easily realize the structure of the OS FET device 140D according to FIG. 3. As mentioned above, the OS FET device 140C includes a first gate structure 142a, a first source electrode 144a and a first drain electrode 146a. According to the modification, the OS FET device 140C is a device of single gate type, therefore the first gate structure 142a includes one gate electrode 1420, a gate dielectric layer 1422 and an oxide semiconductor layer 1424 as shown in FIG. 3. The gate electrode 1420 can be formed simultaneously with forming the metal layer 134 in the interconnection structure 130, and thus include material the same with the metal layer 134, but not limited to this. The gate dielectric layer 1422 and the oxide semiconductor layer 1424 can include materials the same with those mentioned in the aforementioned embodiment, therefore those details are omitted for simplicity. Additionally, the source electrode 144a and the drain electrode 146a can include the material the same with the metal layer 134, but not limited to this.

It is noteworthy that in a case that image sensor pixel structure 10 provided by the preferred embodiment is a BSI image sensor pixel structure 10, the substrate 100 is thinned down from the back side 100B, and followed by forming passivation layer, anti-reflection coating, color filter array (CFA), and micro-lens on the back side 100B of the substrate 100. Additionally, any other process such as outer electrical connection fabricating process can be performed if required. Since the processes are well-known to those skilled in the art, those details are omitted in the interest of brevity. Accordingly, the sensing device 110 is formed to receive an incident light through the back side 100B of the substrate 100.

Furthermore, the capacitor 150 can be electrically connected to the OS FET devices 140C/140D by the metal layer 134 and/or the plug 136, and the OS FET devices 140C/140D can be electrically connected to the sensing device 110 by the metal layer 134, the plug 136 and the contact plug 122. The electrical connection will be detailed.

Please refer to FIGS. 1 and 2 again. According to the image sensor pixel structure and/or BSI image sensor pixel structure 10 provided by the present invention, the two OS FET devices 140C/140D electrically connected to the sensing device 110 and the capacitor 150 are formed on the front side 100F of the substrate 10. Since the two OS FET devices 140C/140D overlap the sensing device 110, and the capacitor 150 overlaps the two OS FET devices 140C/140D, the sensing device 110, the OS FET devices 140C/140D and the capacitor 150 construct a stacked structure. Consequently, the placement of the OS FET devices 140C/140D and the capacitor 150 never increases pixel area. In other words, the stacked structure formed of the sensing device 110, the OS FET devices 140C/140D and the capacitor 150 maintains the integration of the image sensor.

Figure 4:
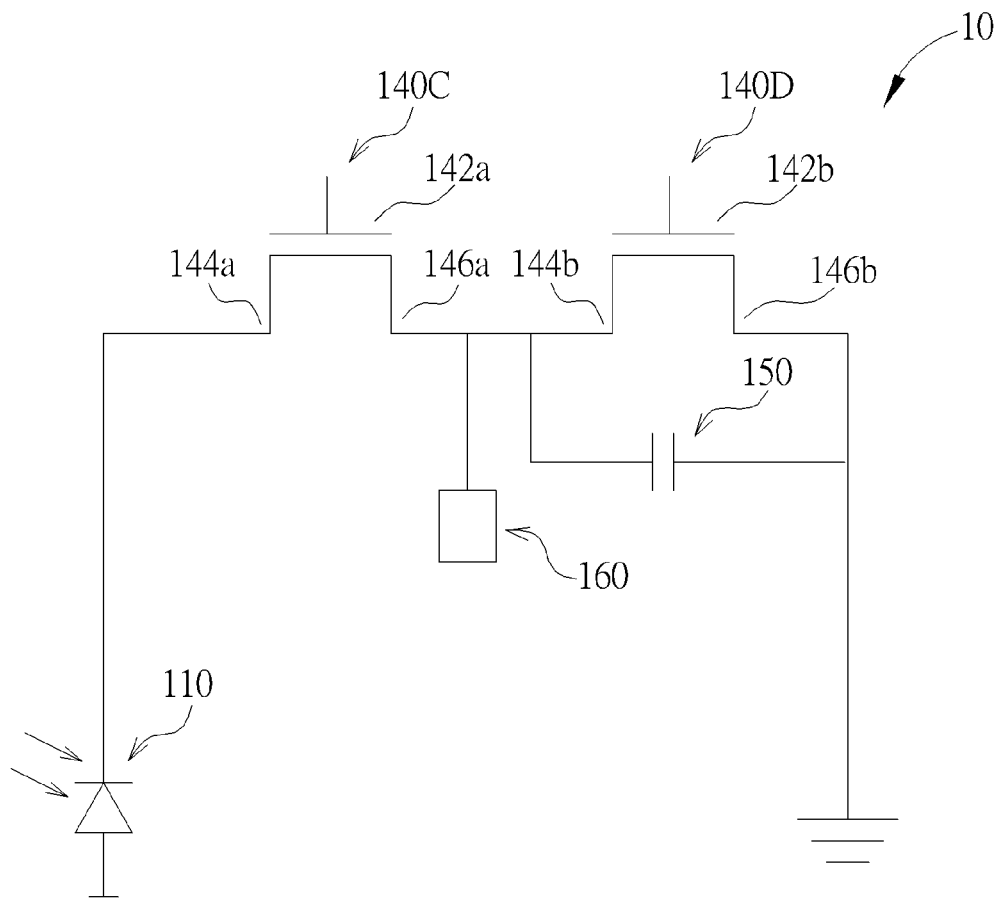
FIG. 4 is a circuit diagram of the image sensor pixel structure provided by the present invention.

Please refer to FIG. 4, which is a circuit diagram of the image sensor pixel structure 10 provided by the present invention. In order to clearly describe the present invention, FIGS. 1, 2 and 4 can be referred together. As mentioned above, the image sensor pixel structure 10 provided by the present invention includes the sensing device 110 formed in the substrate 100, the two OS FET devices 140C/140D formed on the front side 100F of the substrate 100 and the capacitor 150 formed on the front side 100F of the substrate 100. In detail, the OS FET device 140C is a charge control OS FET device and the OS FET device 140D is a discharge control OS FET devices. As shown in FIGS. 1, 2, and 4, the charge control OS FET device 140C is electrically connected to the sensing device 110, the discharge control OS FET device 140D is electrically connected to the charge control OS FET devices 140C, and the capacitor 150 is electrically connected to both of the charge control OS FET device 140C and the discharge control OS FET device 140D.

Specifically, as shown in FIGS. 1-3, the charge control OS FET device 140C includes the first gate structure 142a, the first source electrode 144a and the first drain electrode 146a, and the discharge control OS FET device 140D includes the second gate structure 142b, the second source electrode 144b and the second drain electrode 146b. As mentioned above, the charge control OS FET device 140C and the discharge control OS FET device 140D can be devices of single gate or double gate type. Therefore, the first gate structure 142a and the second gate structure 142b can include structures as shown in FIGS. 1-3. As shown in FIG. 4, according to the preferred embodiment of the present invention, the first source electrode 144a of the charge control OS FET device 140C is electrically connected to the sensing device 110, and the first drain electrode 146a of the charge control OS FET device 140C is electrically connected to the second source electrode 144b of the discharge control OS FET device 140D and the capacitor 150. As shown in FIG. 4, the capacitor 150 and the discharge control OS FET device 140D are electrically connected in parallel, and the parallel capacitor 150 and the discharge control OS FET device 140D are electrically connected to the charge control OS FET device 140C and the sensing device 110 in series.

Furthermore, the image sensor pixel structure 10 provided by the preferred embodiment can further include a sense circuit and/or an analog-to-digital converter (hereinafter abbreviated as ADC) circuit 160 electrically connected to the charge control OS FET device 140C and the discharge control OS FET device 140D.

Please still refer to FIG. 4. According to the preferred embodiment, when the discharge control OS FET device 140D is turned on, electrical charges are removed from the capacitor 150, and when the charge control OS FET device 140C is turned on, electrical charges accessed from the sensing device 110 are stored in the capacitor 150 and read out by the sense circuit and/or ADC circuit 160. Furthermore, the electrical charges are stored in the capacitor 150 when the charge control OS FET device 140C is turned off. Because the OS FET devices 140C/140D suppress short channel effect, it has the advantage of extremely low off-state current. Therefore, power consumption of the image sensor pixel structure and/or BSI image sensor pixel structure 10 is efficaciously and extraordinary reduced due to the OS FET devices 140C/140D. More important, since the electrical charges are stored in the capacitor 150 and the two OS FET devices 140C/140D include the extremely low off-state current, high speed memory and compensation ADC circuit which is conventionally required, are eliminated from the image sensor pixel structure 10 of the preferred embodiment. Consequently, product and process design of the image sensor pixel structure 10 are further simplified.

Also, it should be noted that the image sensor pixel structure 10 provided by the preferred embodiment can be adopted in not only the BSI image sensor, but also in front side illumination (FSI) image sensor. Accordingly, the sensing device 110 can be formed to receive an incident light through the front side 100F or the back side 100B of the substrate 100.

Figure 5:
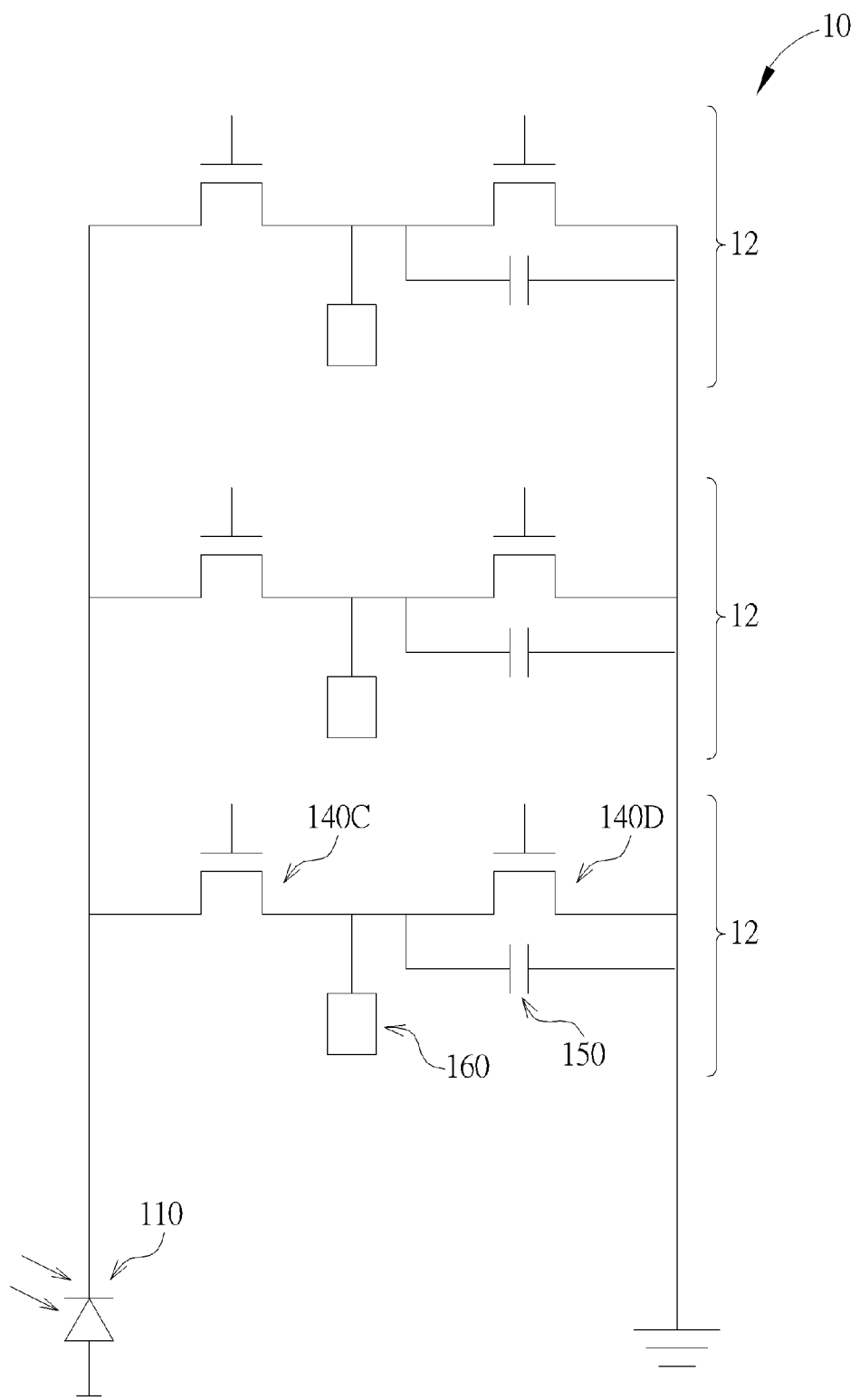
FIG. 5 is a circuit diagram of the image sensor pixel structure provided by another preferred embodiment of the present invention.

Please refer to FIG. 5, which is a circuit diagram of the image sensor pixel structure provided by another preferred embodiment of the present invention. According to the preferred embodiment, the OS FET devices 140C/140D electrically connected to the sensing device 110 and the capacitor 150, even to the sense circuit and/or ADC circuit 160 are referred to as a working module 12 corresponding to each sensing device 110. The numbers of working module 12 corresponding to each sensing device 110 can increased in parallel if required, as shown in FIG. 5.

Briefly speaking, according to the image sensor pixel structure and the BSI image sensor pixel structure provided by the present invention, power consumption is reduced without consuming valuable area on the substrate due to the two OS FET devices (including the charge control OS FET device and discharge control OS FET device).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A back side illumination (BSI) image sensor pixel structure comprising:
a substrate having a front side and a back side opposite to the front side;
a sensing device formed in the substrate to receive an incident light through the back side of the substrate;
two oxide semiconductor field effect transistor (OS FET) devices formed on the front side of the substrate, the OS FET devices being directly stacked on the sensing device and overlapping the sensing device; and
a capacitor formed on the front side of the substrate, the capacitor being directly stacked on the sensing device and the OS FET devices and overlapping the sensing device and the OS FET devices.

2. The BSI image sensor pixel structure according to claim 1, further comprising an interconnection structure formed on the front side of the substrate.

3. The BSI image sensor pixel structure according to claim 2, wherein the OS FET devices and the capacitor are formed in the interconnection structure.

4. The BSI image sensor pixel structure according to claim 2, wherein the interconnection structure comprises a plurality of dielectric layers and a plurality of metal layers.

5. The BSI image sensor pixel structure according to claim 4, wherein the two OS FET devices are all formed in a same dielectric layer of the interconnection structure.

6. The BSI image sensor pixel structure according to claim 5, wherein the OS FET devices are formed in a dielectric layer different from a dielectric layer in which the capacitor is formed.

7. The BSI image sensor pixel structure according to claim 1, wherein the OS FET devices are electrically connected to the sensing device.

8. The BSI image sensor pixel structure according to claim 1, wherein the capacitor is electrically connected to the OS FET devices.

9. The BSI image sensor pixel structure according to claim 1, wherein the OS FET devices respectively comprise a gate structure, a source electrode and a drain electrode.

10. The BSI image sensor pixel structure according to claim 1, wherein the capacitor comprises a metal-insulator-metal (MIM) capacitor.

11. An image sensor pixel structure comprising:
a substrate having a front side and a back side opposite to the front side;
a sensing device formed in the substrate to receive an incident light through the front side or the back side of the substrate;
a charge control oxide semiconductor FET device formed on the front side of the substrate and electrically connected to the sensing device;
a discharge control oxide semiconductor FET device formed on the front side of the substrate and electrically connected to the charge control oxide semiconductor FET device; and
a capacitor formed on the front side of the substrate and electrically connected to the charge control oxide semiconductor FET device and the discharge control oxide semiconductor FET device.

12. The image sensor pixel structure according to claim 11, wherein the capacitor and the discharge control oxide semiconductor FET device are electrically connected in parallel, and the parallel capacitor and discharge control oxide semiconductor FET device are electrically connected to the charge control oxide semiconductor FET device and the sensing device in series.

13. The image sensor pixel structure according to claim 12, wherein the charge control oxide semiconductor FET device comprises a first gate structure, a first source electrode and a first drain electrode, and the discharge control oxide semiconductor FET device comprises a second gate structure, a second source electrode and a drain electrode.

14. The image sensor pixel structure according to claim 13, wherein the first source electrode of the charge control oxide semiconductor FET device is electrically connected to the sensing device.

15. The image sensor pixel structure according to claim 13, wherein the first drain electrode of the charge control oxide semiconductor FET device is electrically connected to the second source electrode of the discharge control oxide semiconductor FET device and the capacitor.

16. The image sensor pixel structure according to claim 11, further comprising at least a first dielectric layer and a second dielectric layer, formed on the front side of the substrate.

17. The image sensor pixel structure according to claim 16, wherein the charge control oxide semiconductor FET device and the discharge control oxide semiconductor FET device are formed in the first dielectric layer.

18. The image sensor pixel structure according to claim 16, wherein the capacitor is formed in the second dielectric layer.

19. The image sensor pixel structure according to claim 11, wherein the capacitor comprises a metal-insulator-metal (MIM) capacitor.

20. The image sensor pixel structure according to claim 11, further comprising a sense circuit and/or an analog-to-digital converter (ADC) circuit electrically connected to the charge control oxide semiconductor FET device and the discharge control oxide semiconductor FET device.

* * * * *